(12) United States Patent
Wang (10) Patent No.: US 9,093,464 B2
(45) Date of Patent: Jul. 28, 2015

(54) METHOD FOR FABRICATING SMALL-SCALE MOS DEVICE (75) Inventor: Le Wang, Wuxi (CN)

(73) Assignees: CSMC TECHNOLOGIES FAB1 CO., LTD., Wuxi (CN); CSMC TECHNOLOGIES FAB2 CO., LTD., Wuxi (CN)

( * ) Notice: Subject to any disclaimer, the term of this patent is extended or adjusted under 35 U.S.C. 154(b) by 247 days.

(21) Appl. No.: 13/807,306

(22) PCT Filed: Oct. 9, 2011

(86) PCT No.: PCT/CN2011/080557
§ 371 (c)(1),
(2), (4) Date: Dec. 28, 2012

(87) PCT Pub. No.: WO2012/048624
PCT Pub. Date: Apr. 19, 2012

(65) Prior Publication Data
US 2013/0109146 A1    May 2, 2013

(30) Foreign Application Priority Data

Oct. 12, 2010 (CN) .......................... 2010 1 0511723

(51) Int. Cl.
*H01L 21/336* (2006.01)
*H01L 29/66* (2006.01)
*H01L 29/78* (2006.01)

(52) U.S. Cl.
CPC ...... *H01L 29/66492* (2013.01); *H01L 29/6659* (2013.01); *H01L 29/66636* (2013.01); *H01L 29/7833* (2013.01); *H01L 29/665* (2013.01)

(58) Field of Classification Search
USPC .......................... 438/305, 306, 307; 257/408
See application file for complete search history.

(56) References Cited

U.S. PATENT DOCUMENTS

| | | | | |
|---|---|---|---|---|
| 5,538,909 A * | 7/1996 | Hsu | ................................ | 438/301 |
| 2006/0270133 A1* | 11/2006 | Yasutake | ....................... | 438/197 |
| 2009/0321851 A1* | 12/2009 | Awano | ......................... | 257/408 |
| 2010/0041201 A1* | 2/2010 | Son et al. | ...................... | 438/305 |
| 2010/0320546 A1* | 12/2010 | Tamura | ......................... | 257/408 |
| 2011/0254015 A1* | 10/2011 | Doris et al. | ..................... | 257/77 |

* cited by examiner

*Primary Examiner* — Jamie C Niesz
(74) *Attorney, Agent, or Firm* — Anova Law Group, PLLC (57) ABSTRACT

A method for fabricating a small-scale MOS device, including: preparing a substrate; forming a first trench in the substrate along a first side of the gate region and forming a second trench in the substrate along a second side of the gate region, the first side of the gate region opposite the second side of the gate region; forming a first lightly doped drain region and a second lightly doped drain region in the first trench and the second trench, respectively; forming a third trench in the substrate overlapping at least a first portion of the first lightly doped drain region and a fourth trench in the substrate overlapping at least a first portion of the second lightly doped drain region; and forming a source region and a drain region in the third trench and the fourth trench, respectively.

19 Claims, 5 Drawing Sheets

METHOD FOR FABRICATING SMALL-SCALE MOS DEVICE

BACKGROUND

1. Field of the Invention

The present invention relates to the field of semiconductor fabrication technique, and more particular to a method for fabricating a small-scale metal-oxide-semiconductor MOS device.

2. Description of the Related Art

With the ever increasing development of Integrated Circuit (IC) fabrication process/device technology, the degree of IC integration is becoming higher, and thus the size of MOS devices is required to be smaller.

The process for fabricating, for example, a NMOS type MOS device generally includes the following steps; (i) growing a screen oxide layer on a substrate, (ii) performing photolithography and P-type ion implantation to form a P well, (iii) growing a gate oxide layer, (iv) depositing polysilicon and performing photolithography and etching to form a gate region, (v) performing photolithography and implantation to form a N-type Lightly Doped Drain (LDD), (vi) depositing Tetraethyl Ortho Silicate (TEOS) and performing photolithography and etching to form a side wall, (vii) performing photolithography and implantation for the source/drain (S/D) regions, (viii) thermally annealing the S/D implant to form the S/D regions, (ix) depositing an Salicide Blocking (SAB) material layer, (x) performing photolithography and etch on the Salicide Blocking (SAB) material layer, and (xi) processing Silicide by metal processing to form a metal contact.

To obtain a small scale MOS device, the depth of the S/D junction must be made shallow during fabrication, which requires high performance control for the implanting apparatus used in the S/D implanting process.

An existing ion implanter is a high-current and low-energy apparatus. Thus, under low energy and high productivity, it is difficult to implement a super-shallow junction technique with this apparatus. Therefore, a shallow S/D junction is difficult to obtain with conventional implantation processing. Further, following the S/D implantation process, the thermal anneal process performed by existing fabrication techniques impedes further scaling of small-scale MOS devices.

SUMMARY

In view of this, the present invention provides a method for fabricating a small-scale MOS device to obtain a shallow source/drain junction, and thus enable further MOS device scaling.

To achieve the above object, the present invention provides following technique solutions. According to one embodiment of the present invention, a method for fabricating a small-scale metal-oxide-semiconductor (MOS) device includes preparing a substrate of a first conductivity type, a gate oxide layer being formed on the substrate, and a gate region being formed on the gate oxide layer. The method further includes forming a first trench in the substrate along a first side of the gate region and forming a second trench in the substrate along a second side of the gate region, the first side of the gate region being opposite the second side of the gate region. The method further includes forming a first lightly doped drain region and a second lightly doped drain region in the first trench and the second trench, respectively. The method further includes forming a third trench in the substrate overlapping at least a first portion of the first lightly doped drain region and a fourth trench in the substrate overlapping at least a first portion of the second lightly doped drain region. The method further includes forming a source region and a drain region in the third trench and the fourth trench, respectively.

According to one specific embodiment, the method for fabricating a small-scale MOS device further includes forming metal silicide on the source region and the drain region respectively. According to another specific embodiment, the step of forming the first trench and forming the second trench further includes forming a photoresist layer having a first trench pattern and a second trench pattern on the gate oxide layer. The step further includes forming the first trench and the second trench by etching through the gate oxide layer and etching into the substrate, the etching being prevented under the photoresist layer and the gate region, and removing the photoresist layer.

According to another specific embodiment, the step of forming the first lightly doped drain region and a second lightly doped drain region further includes filling the first trench with the first lightly doped drain region and filling the second trench with the second lightly doped drain region, the first lightly doped drain region and the second lightly doped drain region being of a second conductivity type.

According to another specific embodiment, the step of forming the third trench and the fourth trench further includes forming a first side wall on the first side of the gate region and forming a second side wall on the second side of the gate region, depositing a salicide blocking (SAB) material layer over the substrate, and forming a photoresist layer having a third trench pattern and a fourth trench pattern on the SAB material layer. The step further includes forming the third trench and the fourth trench by etching through the SAB material layer, etching the first portion of the first lightly doped drain region, etching the first portion of the second lightly doped drain region, and etching into the substrate. The etching is prevented under the photoresist layer, the first side wall, the second side wall, and the gate region. Then, the photoresist layer is removed.

According to one specific embodiment, the step of forming the source region and the drain region further includes filling the third trench with the source region and filling the fourth trench with the drain region, the source region and the drain region being of the second conductivity type. According to another specific embodiment, the step of forming metal silicide on the source region and the drain region respectively further includes, depositing a metal over the substrate and on the SAB material layer, annealing the metal and forming metal silicide except over the SAB material layer, and removing the metal over the SAB material layer.

According to another specific embodiment, the step of preparing a substrate, a gate oxide layer being formed on the substrate, and a gate region being formed on the gate oxide layer, further includes (i) preparing a substrate, (ii) forming a screen oxide layer on the substrate, (iii) forming a well region of the first conductivity type in the substrate, (iv) removing the screen oxide layer, (v) forming a gate oxide layer on the substrate, and (vi) forming a gate region on the gate oxide layer.

According to another specific embodiment, the step of forming the first side wall and forming the second side wall includes depositing a dielectric layer over the substrate, and etching back the dielectric layer by an anisotropic etch process. According to another specific embodiment, the gate region is $SrTiO_3$, $HfO_2$, $ZrO_2$, or polysilicon. According to another specific embodiment, the depths of the third trench and the fourth trench are less than 0.1 μm. According to another specific embodiment, the depths of the third trench and the fourth trench are greater than the depths of the first trench and the second trench.

According to another specific embodiment, an upper surface of the first lightly doped drain region and an upper surface of the second lightly doped drain region are substantially at the same plane as an upper surface of the substrate. According to another specific embodiment, the step of filling the first trench and filling the second trench is by selective epitaxial growth in the first trench and in the second trench. According to another specific embodiment, an upper surface of the source region and an upper surface of the drain region are substantially at the same plane as an upper surface of the substrate. According to another specific embodiment, the step of filling the third trench and filling the fourth trench is by selective epitaxial growth in the third trench and in the fourth trench.

It may be seen from the above technical solutions that, according to the present invention, a first trench and a second trench are formed in the substrate at both sides of a gate region respectively, and a first lightly doped drain region and a second lightly doped drain region are formed respectively in the first trench and the second trench; similarly, a third trench and a fourth trench are formed in the substrate outside the first trench and the second trench respectively, and a source region and a drain region are formed in the third trench and the fourth trench respectively. Compared with the existing implanting technique in the prior art, the method for implementing according to the present invention forms four trenches in the substrate sequentially, depth of which may be controlled accurately by etching time, and the depths of the third trench and the fourth trench correspond to the depth of a source/drain junction formed later, and thus a shallow source/drain junction may be formed by controlling the etching time to fabricate a small-scale MOS device.

Furthermore, in the method provide by the present invention, implanting process is not performed for the source/drain formation; therefore a source/drain annealing process is omitted in the following steps, thus decreasing the steps in the technology flow and simplifying the process for fabricating a small-scale MOS device.

A better understanding of the nature and advantages of the embodiments of the present invention may be gained with reference to the following detailed description and the accompanying drawings.

DETAILED DESCRIPTION

To make the above objects, features and advantages more apparent to be understood, embodiments of the present invention will be further described in detail in conjunction with the drawings hereinafter.

To facilitate the sufficient understanding of the invention, many details are explained in the following descriptions, however the present invention may be implemented in other manners than those described herein, and similar extensions may be made by those skilled in the art without deviating from the spirit of the present invention, therefore the present invention is not restricted by the embodiments disclosed hereinafter.

Furthermore, the present invention is described in detail in conjunction with the simplified cross sectional views. In describing the embodiments of the present invention, to facilitate the description, sectional views showing structures of the device are magnified locally without conforming to a general scaling, and the mentioned simplified cross sectional views are only examples and should not restrict the scope of protection of the present invention. Moreover, three-dimensional size, i.e. the length, the width and the depth, should be given in view of practical implementation.

According to embodiments of the present invention, a method for fabricating a small-scale MOS device is provided to obtain a shallow source/drain junction, and thus enable further MOS device scaling. The S/D formation may be accomplished by etching trenches in the substrate that are self-aligned to the gate region. The trenches are then filled using in-situ-doped, selective epitaxy to grow the LDD and S/D regions in the trenches, without using ion implantation and the associated thermal annealing steps for activating the implant. The trench depth may be more accurately controlled by the trench etch process and the thermal budget for the fill process may be lower than processing by known implantation and thermal annealing techniques. Thus, greater MOS device size reduction is enabled.

Figure 1:
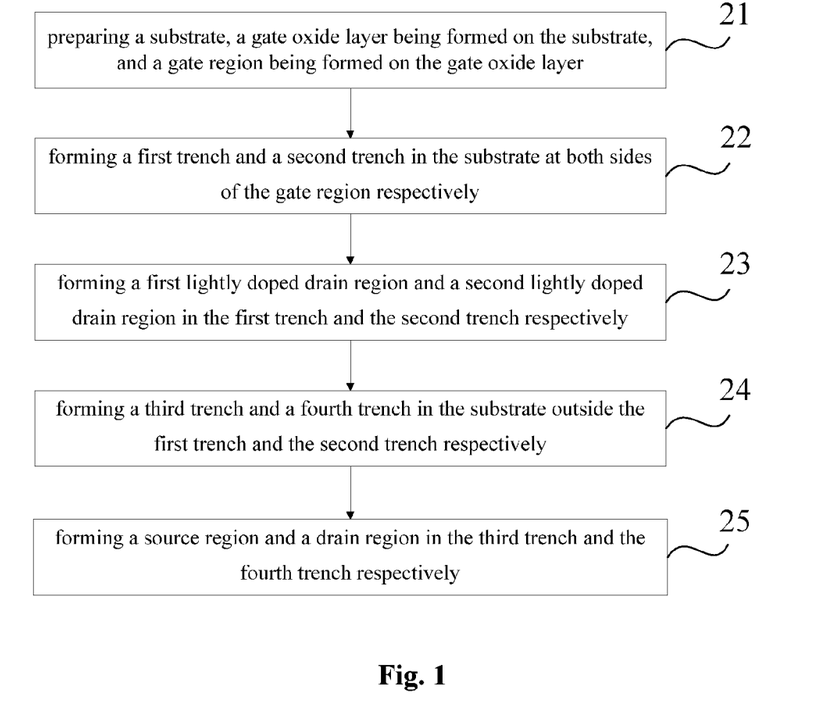
FIG. 1 is a flow chart showing a method for fabricating a small-scale MOS device, in accordance with an embodiment of the present invention.

FIG. 1 is a flow chart showing a method for fabricating a small-scale MOS device, in accordance with an embodiment of the present invention, which shows the following steps. A substrate of a first conductivity type is prepared 21, a gate oxide layer being formed on the substrate, and a gate region being formed on the gate oxide layer. For example, the conductivity type of the substrate may, be p-type for an NMOS device.

Figure 2:
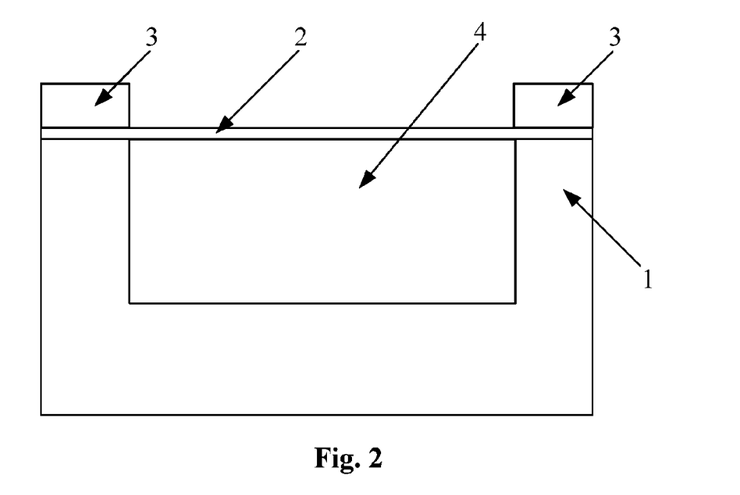
FIG. 2 to FIG. 10 are simplified cross sectional views showing a process for fabricating a small-scale MOS device, in accordance with embodiments of the present invention.

The step 21 may also include the following steps. FIG. 2 to FIG. 10 are simplified cross sectional views showing a process for fabricating a small-scale MOS device, in accordance with embodiments of the present invention. Referring to FIG. 2, a substrate 1 is prepared. The substrate prepared in this embodiment may include a body layer and an epitaxial layer (not shown), wherein the body layer is P-type monocrystalline silicon; and the epitaxial layer is lightly doped monocrystalline silicon growing on the P-type monocrystalline silicon. Compared with the body layer, the epitaxial layer has the same lattice structure, a higher purity and fewer lattice defects. In other embodiments, the body layer may also be other semiconductor materials such as germanium, indium phosphide, or gallium arsenide.

A screen oxide layer 2 is formed on the substrate. The screen oxide layer may be grown on the substrate by a thermal oxidation process, and the screen oxide layer is silicon dioxide in this embodiment. The screen oxide layer is provided to reduce defect formation in the substrate during subsequent ion implantation of the well region, and thus the thickness of the screen oxide may be thin, which is generally approximately 150 Å.

A well region of the first conductivity type is formed in the substrate. Referring to FIG. 2, in accordance with an embodiment of the present invention, photoresist is spin coated on screen oxide layer 2; next, the photoresist is exposed using a corresponding photomask, and then the development is performed; and a photoresist layer 3 with a well region pattern is formed on screen oxide layer 2. A well region 4 is formed in substrate 1 using ion implantation, by using the photoresist layer 3 with the well region pattern as a mask. In the present invention, the implanted ion is Boron B ion, and the formed well region 4 is P well. After removing photoresist layer 3, annealing is performed on the substrate to remove crystal lattice damage due to the ion implantation and to activate the implanted ions. After the annealing process is performed, well region 4 is formed. Then screen oxide layer 2 is removed from substrate 1.

Figure 3:
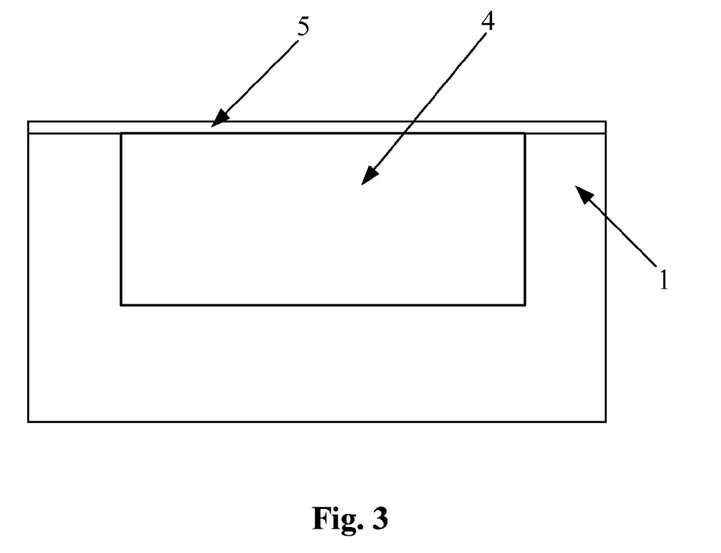

Referring to FIG. 3, in accordance with an embodiment of the present invention, a gate oxide layer 5 is formed over substrate 1 and on the well region 4 by thermal oxidization processes, and the thickness of gate oxide layer 5 may be between approximately 20 Å to hundreds of Å. In this embodiment, gate oxide layer 5 is silicon dioxide. The gate region is formed next on the gate oxide layer.

Figure 4:
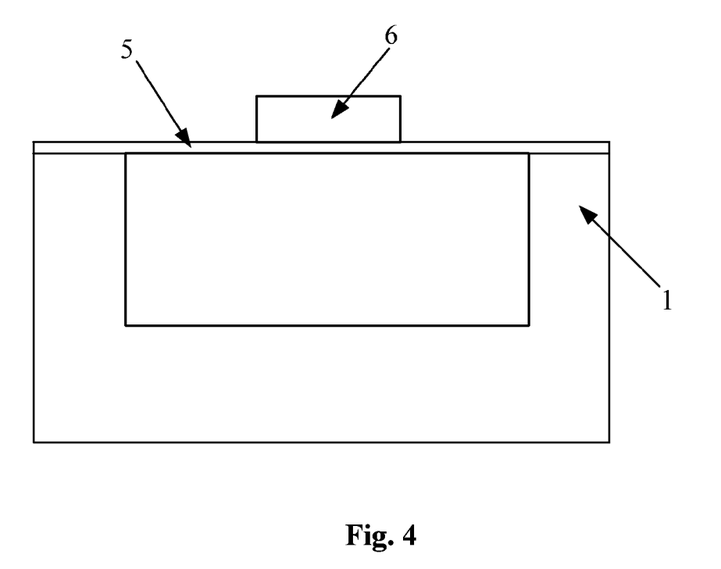

Referring to FIG. 4, in accordance with an embodiment of the present invention, a gate region material layer is deposited on gate oxide layer 5. In this embodiment, the gate region material is $SrTiO_3$, and in other embodiments, the gate region material may also be material with high dielectric constant, such as $HfO_2$ or $ZrO_2$, and may also be material such as polysilicon. Then, photoresist is spin coated on the gate region material layer; next the photoresist is exposed using a corresponding photomask, and then the development is performed to form a photoresist layer with a gate region pattern on the gate region material layer. Then the gate region material layer is etched using the photoresist layer with the gate region pattern as a mask, and thus a gate region 6 is formed on gate oxide layer 5. After the gate region 6 is formed, the photoresist is removed.

Referring back to FIG. 1, Step 22 shows forming a first trench and a second trench in the substrate at both sides of the gate region, respectively. In other words, step 22 shows forming a first trench in the substrate along a first side of the gate region and forming a second trench in the substrate along a second side of the gate region, the first side of the gate region being opposite the second side of the gate region. Step 22 may include the steps of forming a photoresist layer having a first trench pattern and a second trench pattern on the gate oxide layer; forming the first trench and the second trench by etching through the gate oxide layer and etching into the substrate, the etching being prevented under the photoresist layer and the gate region; and removing the photoresist layer.

Figure 5:
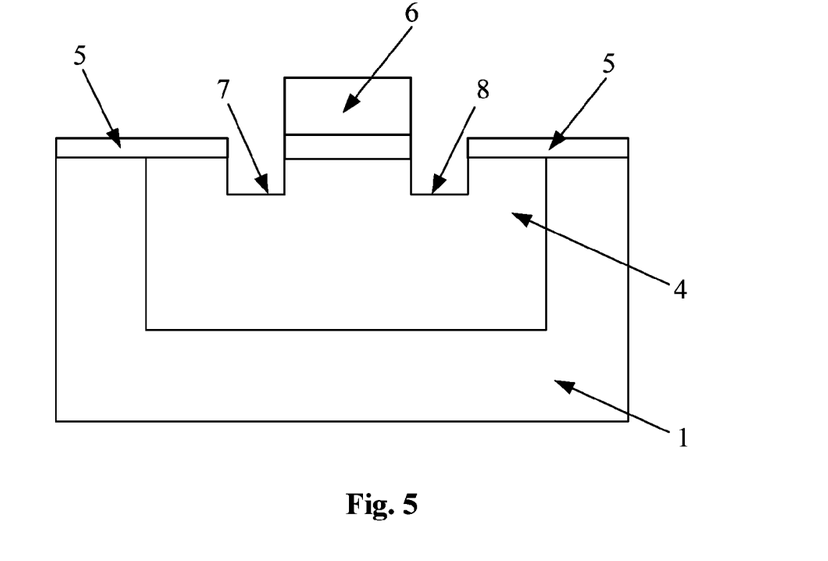

Referring to FIG. 5, in accordance with an embodiment of the present invention, photoresist is spin coated over the substrate 1, on gate oxide layer 5 and the gate region.

The photoresist is exposed using a corresponding photomask. After the exposure, the development is performed to form a photoresist layer with a first trench pattern and a second trench pattern. The patterning for the photoresist may be adapted to merge the pattern for the first trench pattern and the second trench pattern into one region, which substantially overlaps the gate region. A first trench 7 and a second trench 8 are formed respectively in well 4 in substrate 1 at both sides of the gate region 6 through etching processes by using the photoresist layer with the first trench pattern and the second trench pattern as a mask. Further, the gate region also serves as a mask. Thus, first trench 7 may be formed self-aligned to the first side of gate region 6, and second trench 8 may be formed self-aligned to the second side of gate region 6. The first trench 7 and the second trench 8 are located in the well region 4, and the depths of the first trench 7 and the second trench 8 are substantially the same. After a first trench 7 and a second trench 8 are formed, the photoresist is removed. The first trench 7 and the second trench 8 are located close to both sides of the gate region 6, and the depths thereof are controlled accurately by etching time.

Referring again to FIG. 1, Step 23 shows forming a first lightly doped drain region and a second lightly doped drain region in the first trench and the second trench, respectively. The step of forming the first lightly doped drain region and a second lightly doped drain region may further include filling the first trench with the first lightly doped drain region and filling the second trench with the second lightly doped drain region, the first lightly doped drain region and the second lightly doped drain region being of a second conductivity type. An upper surface of the first lightly doped drain region and an upper surface of the second lightly doped drain region may be formed substantially at the same plane as an upper surface of the substrate. The step of filling the first trench and filling the second trench may be by selective epitaxial growth in the first trench and in the second trench.

Figure 6:
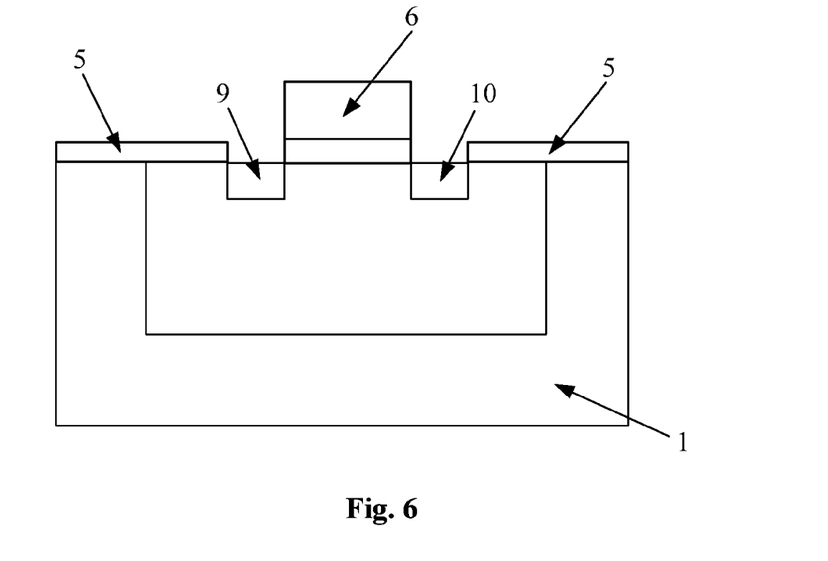

Referring now to FIG. 6, in accordance with an embodiment of the present invention, a lightly doped drain epitaxial growth is performed in the first trench and the second trench by epitaxial growth processes. Because the substrate 1 outside the first trench and the second trench (i.e. at the sides far away from gate region 6) is coated with gate oxide layer 5, the epitaxial growth is selective epitaxial growth, i.e., the epitaxial growth is performed only in the first trench and the second trench. Therefore, the result of the selective epitaxial growth is that a first lightly doped drain region 9 and a second lightly doped drain region 10 are formed at both sides of gate region 6, respectively. In this embodiment, first lightly doped drain region 9 and the second lightly doped drain region 10 are both N-type LDDs. Furthermore, in this embodiment, the epitaxial growth may use low temperature selective epitaxial growth, in which the low temperature is about between 600° C. to 800° C. Doping concentration may be non-uniform if the temperature is too high. First lightly doped drain region 9 and a second lightly doped drain region 10 may be formed using in-situ doping during epitaxy formation. The fill heights of first lightly doped drain region 9 and second lightly doped drain region 10 formed by epitaxial growth in the trenches may be substantially kept at a same plane with the surface of substrate 1.

Referring again to FIG. 1, Step 24 shows forming a third trench and a fourth trench in the substrate outside the first trench and the second trench, respectively. In other words, Step 24 shows forming a third trench in the substrate overlapping at least a first portion of the first lightly doped drain region and a fourth trench in the substrate overlapping at least a first portion of the second lightly doped drain region.

Step 24 may include forming a first side wall on the first side of the gate region and forming a second side wall on the second side of the gate region. The step of forming the first side wall and forming the second side wall may include depositing a dielectric layer over the substrate, and etching back the dielectric layer by an anisotropic etch process. A dielectric layer is deposited over the substrate, and the dielectric layer spreads all over the surface of the gate region, the first lightly doped drain region, the second lightly doped drain region, and over the gate oxide layer 5. In this embodiment, the dielectric layer is silicon dioxide.

Figure 7:
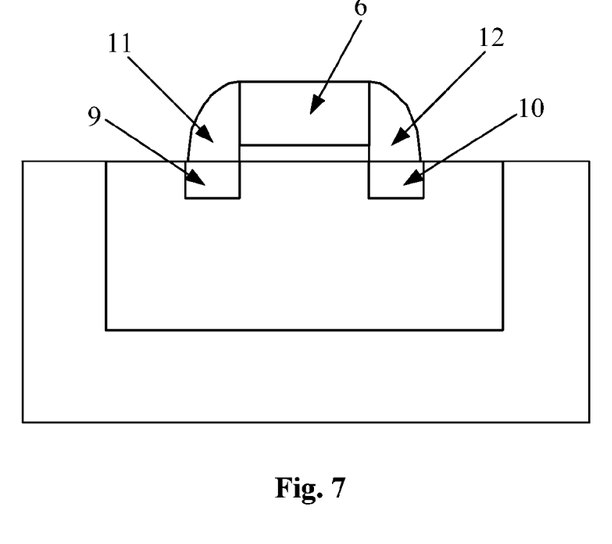

The dielectric layer is etched back by dry etching process. In this embodiment, the etching back process is performed by an anisotropic plasma etcher, which does not need a mask. Referring to FIG. 7, in accordance with an embodiment of the present invention, the result of the etching back process is that a first side wall 11 is formed on the first side of the gate region 6, and a second side wall 12 is formed on the second side of the gate region 6. First side wall 11 and second side wall 12 are located at opposite sides of the gate region 6 to avoid source-drain punch through that may be induced by a following step of forming the sources and drains.

Step 24 may further include depositing a salicide blocking (SAB) material layer over the substrate. In this embodiment, the SAB material layer is silicon dioxide. Then, a photoresist layer is formed having a third trench pattern and a fourth trench pattern on the SAB material layer. Step 24 may further include forming the third trench and the fourth trench by etching through the SAB material layer, etching the first portion of the first lightly doped drain region, etching the first portion of the second lightly doped drain region, and etching into the substrate. The etching is prevented under the photoresist layer, the first side wall, the second side wall, and the gate region. Then the photoresist layer is removed Referring to FIG. 8, in accordance with an embodiment of the present invention, photoresist is spin coated over the substrate 1 on the SAB material layer. The photoresist is exposed using an existing S/D (or SAB) photomask. After the exposure, the development is performed to form a photoresist layer 16 with a third trench pattern and a fourth trench pattern over the substrate 1 on the SAB material layer. The patterning for the photoresist may be adapted to merge the pattern for the third trench pattern and the fourth trench pattern into one region, which substantially overlaps the gate region.

Figure 8:
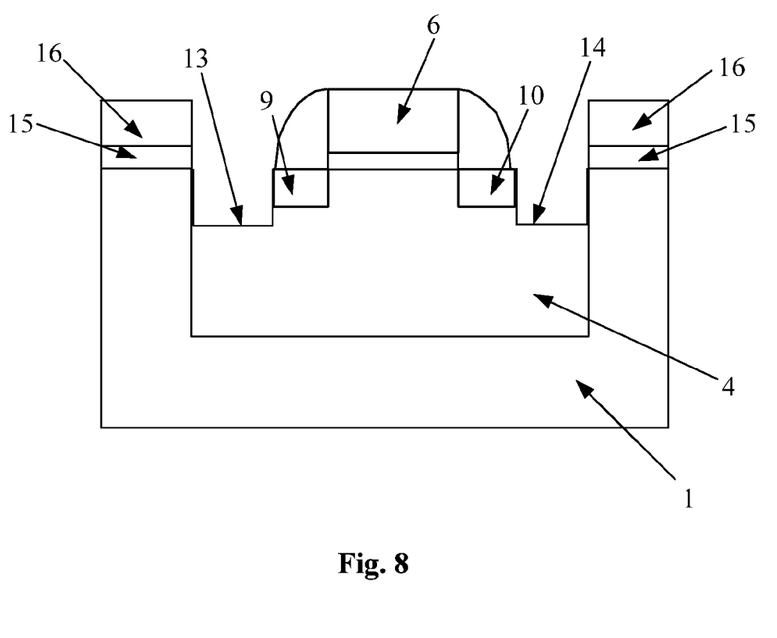

A third trench 13 and a fourth trench 14 are formed respectively in well region 4 in substrate 1 outside first side wall 11 and outside second side wall 12 using etching processes, by using the photoresist layer 16 with the third trench pattern and the fourth trench pattern as a mask. Further, the first side wall, the second side wall, and the gate region also serve as masks against the etching. Thus, third trench 13 may be formed self-aligned to both first side wall 11 and the first side of gate region 6, and fourth trench 14 may be formed self-aligned to both second side wall 12 and the second side of gate region 6.

The etching of trench 13, may also remove a portion of first LDD region 9 furthest away from the first side of gate region 6. Similarly, the etching of trench 14, may also remove a portion of second LDD region 10 furthest away from the second side of gate region 6. Thus, trench 13 and 14 are self-aligned to first LDD region 9 and second LDD region 10, respectively. At the same time, a SAB material layer 15 is left formed on the substrate 1 under patterned photoresist layer 16. The third trench and the fourth trench are located in the well region 4, the depths thereof are substantially the same, which may be greater than the depths of the first trench and the second trench. The depths of the third trench 13 and the fourth trench 14 are controlled accurately by etching time, and are less than 0.1 μm in this embodiment. And then the photoresist layer 16 is removed.

Referring again to FIG. 1, Step 25 shows forming a source region and a drain region in the third trench and the fourth trench respectively. The step of forming the source region and the drain region further may further include filling the third trench with the source region and filling the fourth trench with the drain region, the source region and the drain region being of the second conductivity type. An upper surface of the source region and an upper surface of the drain region may be formed substantially at the same plane as an upper surface of the substrate. The step of filling the third trench and filling the fourth trench may be by selective epitaxial growth in the third trench and in the fourth trench.

Figure 9:
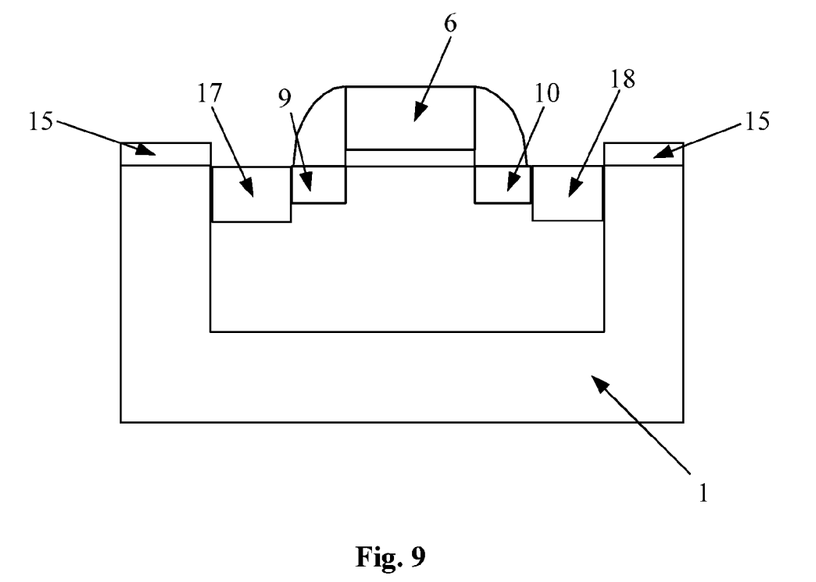

Referring to FIG. 9, in accordance with an embodiment of the present invention, a source/drain epitaxial growth is performed in the third trench and the fourth trench by epitaxial growth processes. Because the substrate 1 outside the third trench and the fourth trench (i.e. at the sides far away from the gate region 6) is coated with the SAB material layer 15, the epitaxial growth is selective epitaxial growth, i.e., the epitaxial growth is performed only in the third trench and the fourth trench. Therefore, the result of the selective epitaxial growth is that a source region 17 and a drain region 18 are formed respectively self-aligned to first lightly doped drain region 9 and second lightly doped drain region 10 at the sides further out from gate region 6. In this embodiment, source region 17 and drain region 18 are N-type source/drain. Furthermore, in this embodiment, the epitaxial growth is low temperature selective epitaxial growth, in which the low temperature is about between 600° C. to 800° C. Doping concentration may be non-uniform if the temperature is too high. The fill heights of source region 17 and drain region 18 formed by epitaxial growth in the trenches may be substantially kept at a same plane with the surface of the substrate 1. Source region 17 and drain region 18 may be formed using in-situ doping during epitaxy formation. The doping concentrations of source region 17 and drain region 18 may be greater than those of first lightly doped drain region 9 and second lightly doped drain region 10.

It may be seen from the above embodiments that the depths of the third trench and the fourth trench are corresponding to the depths of junctions of the source region and the drain region formed later, and the depths of the third trench and the fourth trench may be controlled accurately by etching time. Therefore, a source/drain shallow junction may be formed by controlling the etching time, so as to fabricate a small-scale MOS device.

Furthermore, in the method provided by the present invention, the processes of forming the lightly doped drain region, the source region and the drain region do not adopt the implantation process used in conventional process, and thus the annealing process is omitted, so as to simplify the whole process flow.

In accordance with an embodiment of the present invention, the method for fabricating a small-scale MOS device may further include forming metal silicide on the source region and the drain region, respectively. Metal silicide may be optionally formed on portions of the first LDD region and the second LDD region that extend out from under first sidewall 11 and second sidewall 12, respectively. The step of forming metal silicide on the source region and the drain region respectively may further include; depositing a metal over the substrate and on the SAB material layer, annealing the metal and forming metal silicide except over the SAB material layer, and removing the metal over the SAB material layer.

When the third trench and the fourth trench are formed in the substrate in the SAB material layer is left on the substrate. In this embodiment, metal is deposited over the substrate and on the SAB material layer by sputtering process, wherein the metal may be Ti, Co or other metal. Then an annealing process may be performed on the metal, and the metal does not react with the silicon oxide (the SAB material layer). Therefore, those two materials will not be chemical bonded and physically aggregated. However, the metal will react with silicon in the substrate during the annealing to generate a corresponding metal silicide, such as $TiSi_2$ or $CoSi_2$. Thus, after the annealing process is performed on the metal, metal silicide is formed on the source region and the drain region respectively, and optionally formed on portions of the first LDD region and the second LDD region that extend out from under first sidewall 11 and second sidewall 12, respectively.

Because that the metal does not react with the SAB material layer on the substrate, the metal that is not subjected to the reaction may be etched off easily. That is to say, the metal on regions of the substrate except the source region and the drain region and optionally on portions of the first LDD region and the second LDD region that extend out from under first sidewall 11 and second sidewall 12, respectively, is removed. Then, the SAB material layer on the substrate may be removed.

Figure 10:
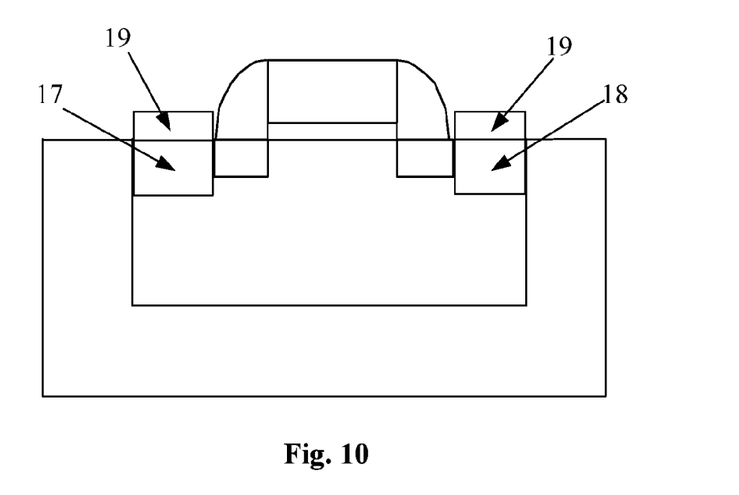

FIG. 10, in accordance with an embodiment of the present invention, shows metal silicide 19 on the source region 17 and the drain region 18. Whether metal silicide is formed on the gate region may be determined as required.

In accordance with an embodiment of the present invention, metal silicide is formed on the source region and the drain region by means of the SAB material layer, which was defined by the photolithography step used to define the third and the fourth trench regions. Compared with the conventional salicide process technique, a photolithography process step is omitted, i.e., source/drain process and SAB process may be performed by photolithography once, so that the cost is decreased and the production efficiency is improved.

It is noted that, in the present invention, relation terms such as "first" and "second" are used only to distinguish one entity or operation from the other entity or operation, but not sure to demand or indicate that there are those actual relations or orders among those entities and operations. Furthermore, the terms "including", "comprising", or any other grammatical variations are used in the inclusive sense of "comprising" with non-excludability, so that process, method, article or device that includes series of the elements include not only those elements but also other elements that are not listed, or further include inherent elements of this process, method, article or device. In the case of no more restriction, an element defined by the sentence "including one . . . " does not indicate that there are no other same elements in the process, method, article or device that includes said element.

In the present specification, the embodiments are described in progression, each embodiment mainly focuses on the difference between itself and other embodiments, therefore the description is brief, and references may be made to those similar parts in the description of the method.

Embodiments of the present invention provide an apparatus and a method for fabricating MOS devices. It will be apparent to those with skill in the art that modifications to the above methods and apparatuses may occur without deviating from the scope of the present invention. The embodiments of the present invention are not limited by the type of transistor, PMOS, NMOS or otherwise, used to fabricating MOS devices. The embodiments of the present invention are not limited by the type of integrated circuit in which the present invention may be disposed. Nor are the embodiments of the present invention limited to any specific type of process technology, e.g., CMOS, Bipolar, or BICMOS that may be used to manufacture MOS devices. Accordingly, the disclosures and descriptions herein are intended to be illustrative, but not limiting, of the scope of the invention, which is set forth in the following claims along with their full scope of equivalents.

What is claimed is:

1. A method for fabricating a small-scale metal-oxide semiconductor (MOS) device comprising:
    preparing a substrate of a first conductivity type;
    forming a gate oxide layer on the substrate;
    forming a gate region on a portion of a top surface of the gate oxide layer;
    forming a first trench in the substrate along a first side of the gate region and passing through the gate oxide layer, and forming a second trench in the substrate along a second side of the gate region and passing through the gate oxide layer, the first side of the gate region being opposite to the second side of the gate region;
    forming a first lightly doped drain region and a second lightly doped drain region to substantially fill the first trench and the second trench, respectively, by a selective epitaxial growth, wherein a remaining portion of the gate oxide layer on the substrate allows the selective epitaxial growth to occur substantially within the first trench and the second trench in the substrate;
    forming a third trench in the substrate overlapping at least a first portion of the first lightly doped drain region and a fourth trench in the substrate overlapping at least a first portion of the second lightly doped drain region; and
    forming a source region and a drain region in the third trench and the fourth trench, respectively.

2. The method according to claim 1, further comprising forming metal silicide on the source region and the drain region respectively.

3. The method according to claim 1, wherein the step of forming the first trench and forming the second trench further comprises:
    forming a photoresist layer having a first trench pattern and a second trench pattern on the gate oxide layer;
    forming the first trench and the second trench by etching through the gate oxide layer and etching into the substrate, the etching being prevented under the photoresist layer and the gate region; and
    removing the photoresist layer.

4. The method according to claim 1, wherein the first lightly doped drain region and the second lightly doped drain region are of a second conductivity type.

5. The method according to claim 1, wherein the step of forming the third trench and the fourth trench further comprises:
    forming a first side wall on the first side of the gate region and forming a second side wall on the second side of the gate region;
    depositing a salicide blocking (SAB) material layer over the substrate;
    forming a photoresist layer having a third trench pattern and a fourth trench pattern on the SAB material layer;
    forming the third trench and the fourth trench by etching through the SAB material layer, etching the first portion of the first lightly doped drain region, etching the first portion of the second lightly doped drain region, and etching into the substrate, the etching being prevented under the photoresist layer, the first side wall, the second side wall, and the gate region, and
    removing the photoresist layer.

6. The method according to claim 5, further comprising:
    forming a metal silicide on the source region and the drain region respectively by:
        depositing a metal over the substrate and on the SAB material layer;
        annealing the metal and forming metal silicide except over the SAB material layer; and
        removing the metal over the SAB material layer.

7. The method according claim 5, wherein the step of forming the first side wall and forming the second side wall comprises:
    depositing a dielectric layer over the substrate; and
    etching back the dielectric layer by an anisotropic etch process.

8. The method according to claim 1, wherein the step of forming the source region and the drain region further comprises:
    filling the third trench with the source region and filling the fourth trench with the drain region, the source region and the drain region being of a second conductivity type.

9. The method according claim 8, wherein an upper surface of the source region and an upper surface of the drain region are substantially at the same plane as an upper surface of the substrate.

10. The method according claim 8, wherein the step of filling the third trench and filling the fourth trench is by selective epitaxial growth in the third trench and in the fourth trench.

11. The method according to claim 1, wherein the step of preparing a substrate further comprises:
   providing a substrate;
   forming a screen oxide layer on the substrate;
   forming a well region of the first conductivity type in the substrate, wherein the gate region is formed over the well region; and
   removing the screen oxide layer.

12. The method according to claim 1, wherein the gate region is SrTiO$_3$, HfO$_2$, ZrO$_2$, or polysilicon.

13. The method according to claim 1, wherein the depths of the third trench and the fourth trench in the substrate are substantially the same and are less than 0.1 μm.

14. The method according to claim 1, wherein the depths of the third trench and the fourth trench are greater than the depths of the first trench and the second trench.

15. The method according claim 1, wherein an upper surface of the first lightly doped drain region and an upper surface of the second lightly doped drain region are substantially at the same plane as an upper surface of the substrate.

16. A method for fabricating a small-scale metal-oxide-semiconductor (MOS) device comprising:
   preparing a substrate of a first conductivity type, a gate oxide layer being formed on the substrate, and a gate region being formed on the gate oxide layer;
   forming a first trench in the substrate along a first side of the gate region and forming a second trench in the substrate along a second side of the gate region, the first side of the gate region being opposite the second side of the gate region;
   filling the first trench with a first lightly doped drain region and filling the second trench with a second lightly doped drain region, the first lightly doped drain region and the second lightly doped drain region being of a second conductivity type;
   forming a first side wall on the first side of the gate region and forming a second side wall on the second side d the gate region;
   depositing a salicide blocking (SAB) material layer over the substrate;
   forming a photoresist layer having a third trench pattern and a fourth trench pattern on the SAB material layer;
   forming a third trench and a fourth trench in the substrate by etching through the SAB material layer, etching a first portion of the first lightly doped drain region, etching a first portion of the second lightly doped drain region, and etching into the substrate, the etching being prevented under the photoresist layer, the first side wall, the second side wall, and the gate region, and removing the photoresist layer;
   forming a source region and a drain region in the third trench and the fourth trench, respectively;
   depositing a metal over the substrate and on the SAB material layer; and
   annealing the metal and forming metal silicide except over the SAB material layer, and removing the metal over the SAB material layer to form a metal silicide on the source region and the drain region respectively.

17. The method according to claim 16, wherein the depths of the third trench and the fourth trench are substantially the same in the substrate and are less than 0.1 μm.

18. The method according to claim 16, wherein the depths of the third trench and the fourth trench are greater than the depths of the first trench and the second trench in the substrate.

19. The method according to claim 16, wherein each step of filling the first trench with the first lightly doped drain region, filling the second trench with the second lightly doped drain region, and forming the source region and the drain region comprises:
   an in-situ-doped, selective epitaxial growth.

\* \* \* \* \*